(12) United States Patent
Yamanaka

(10) Patent No.: US 11,063,509 B2
(45) Date of Patent: Jul. 13, 2021

(54) STEP-UP SWITCHING POWER SUPPLY CIRCUIT

(71) Applicant: DENSO CORPORATION, Kariya (JP)

(72) Inventor: Yutaka Yamanaka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/933,431

(22) Filed: Jul. 20, 2020

(65) Prior Publication Data

US 2020/0366189 A1 Nov. 19, 2020

Related U.S. Application Data

(63) Continuation of application No. PCT/JP2018/041007, filed on Nov. 5, 2018.

(30) Foreign Application Priority Data

Jan. 25, 2018 (JP) .............................. JP2018-010547

(51) Int. Cl.
*H02M 1/32* (2007.01)
*G01R 31/52* (2020.01)
(Continued)

(52) U.S. Cl.
CPC .......... *H02M 1/32* (2013.01); *G01R 31/3277* (2013.01); *G01R 31/52* (2020.01); *H02M 1/08* (2013.01);
(Continued)

(58) Field of Classification Search
CPC ............ H02M 1/32; H02M 2001/325; H02M 1/4225; H02M 3/156; H02M 1/08; G01R 31/3277
See application file for complete search history.

(56) References Cited

U.S. PATENT DOCUMENTS

2005/0077882 A1 4/2005 Nishino
2008/0030173 A1 2/2008 Nishino
(Continued)

FOREIGN PATENT DOCUMENTS

JP 2004-357437 A 12/2004
JP 2014-128183 A 7/2014
(Continued)

*Primary Examiner* — Alex Torres-Rivera
(74) *Attorney, Agent, or Firm* — Posz Law Group, PLC

(57) ABSTRACT

A step-up switching power supply circuit executes a step-up operation for stepping up an input voltage supplied through an input terminal. The step-up switching power supply circuit includes: an inductor; a switching element enlarging a current flowing through the inductor when the switching element is turned on; a step-up control circuit controlling the switching element to execute the step-up operation; a fault detection control circuit controlling the switching element to detect a fault of the switching element; a current detection unit detecting a current flowing through the switching element; and a switching unit executing switchover between the step-up control circuit and the fault detection control circuit to control the driving the switching element, Prior to execution of the step-up operation, the switching unit switches the fault detection control circuit to control the switching element.

6 Claims, 12 Drawing Sheets

(51) Int. Cl.
  *G01R 31/327* (2006.01)
  *H02M 1/08* (2006.01)
  *H02M 3/156* (2006.01)
  *H02M 1/42* (2007.01)
(52) U.S. Cl.
  CPC .......... *H02M 3/156* (2013.01); *H02M 1/4225* (2013.01)

(56) References Cited

U.S. PATENT DOCUMENTS

| | | | |
|---|---|---|---|
| 2009/0085547 A1 | 4/2009 | Nishino | |
| 2010/0242920 A1 | 9/2010 | Omori et al. | |
| 2013/0051100 A1* | 2/2013 | Daigo | H02J 7/14 363/124 |
| 2013/0257062 A1* | 10/2013 | Sakakibara | F02N 11/0814 290/38 R |
| 2014/0092652 A1* | 4/2014 | Kihara | H02M 1/32 363/50 |
| 2014/0168567 A1* | 6/2014 | Kikuchi | H05B 45/347 349/61 |
| 2017/0034887 A1* | 2/2017 | Ichikawa | B60Q 1/04 |
| 2018/0287500 A1* | 10/2018 | Tsutsui | H02M 3/1584 |

FOREIGN PATENT DOCUMENTS

| | | |
|---|---|---|
| JP | 2015-171246 A | 9/2015 |
| JP | 2017-038424 A | 2/2017 |

* cited by examiner

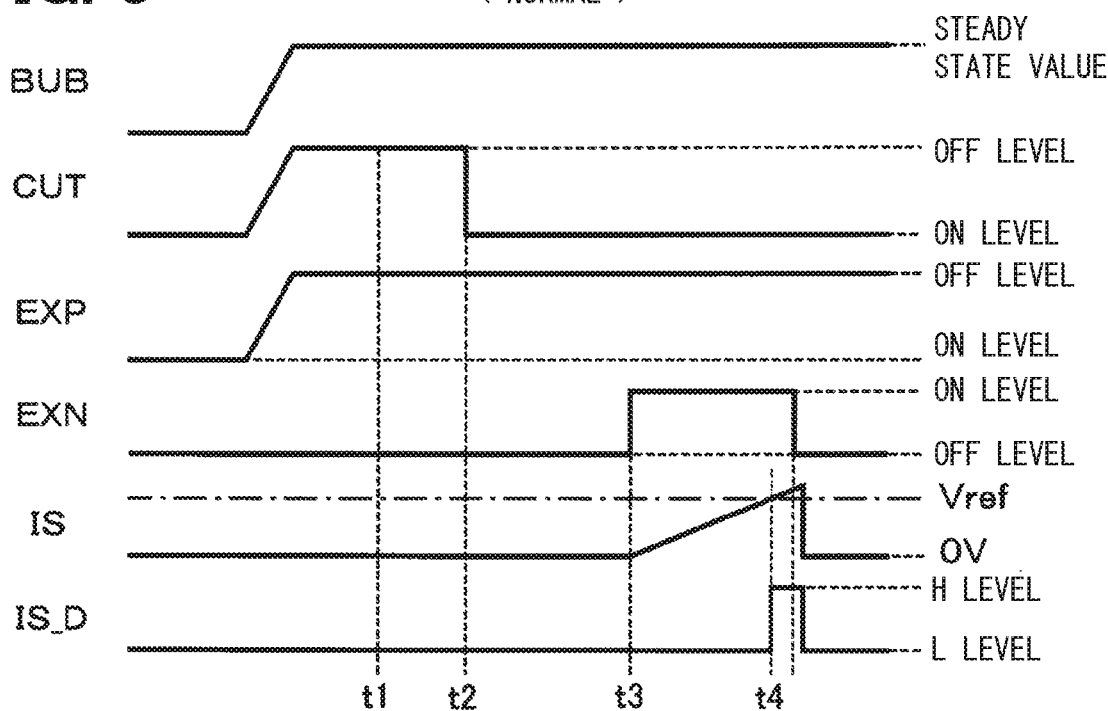
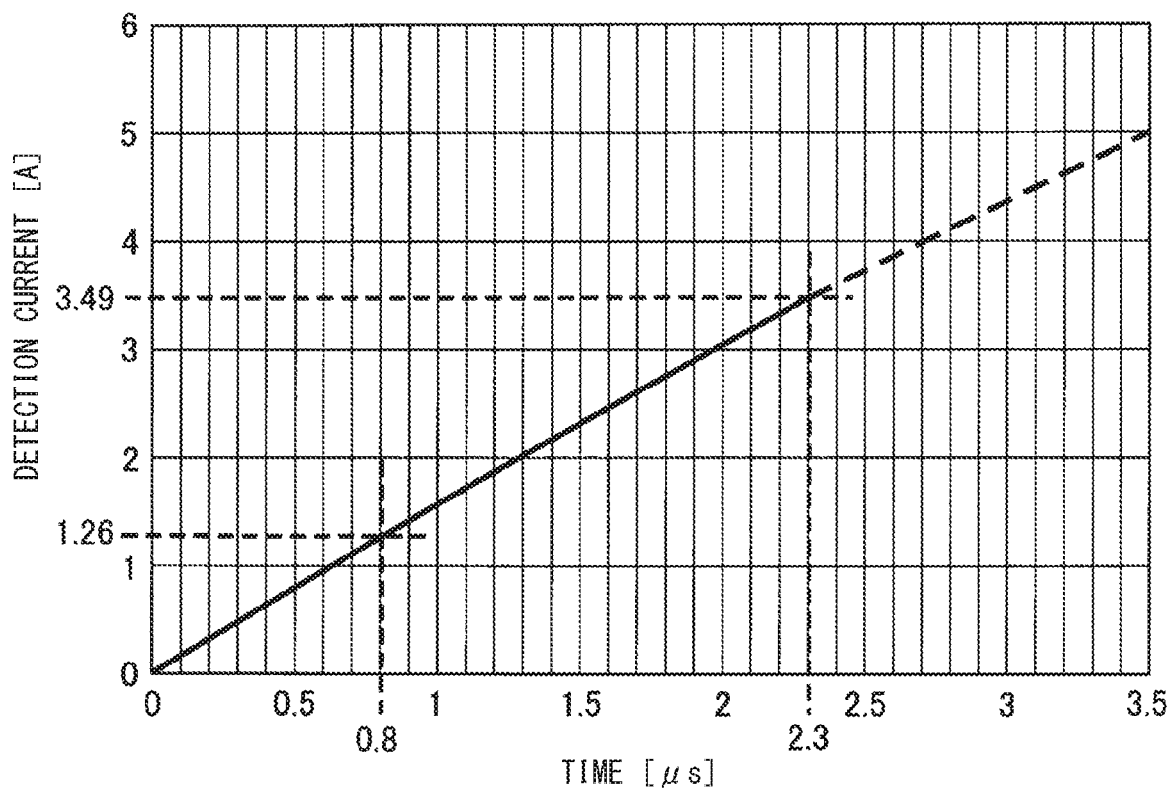

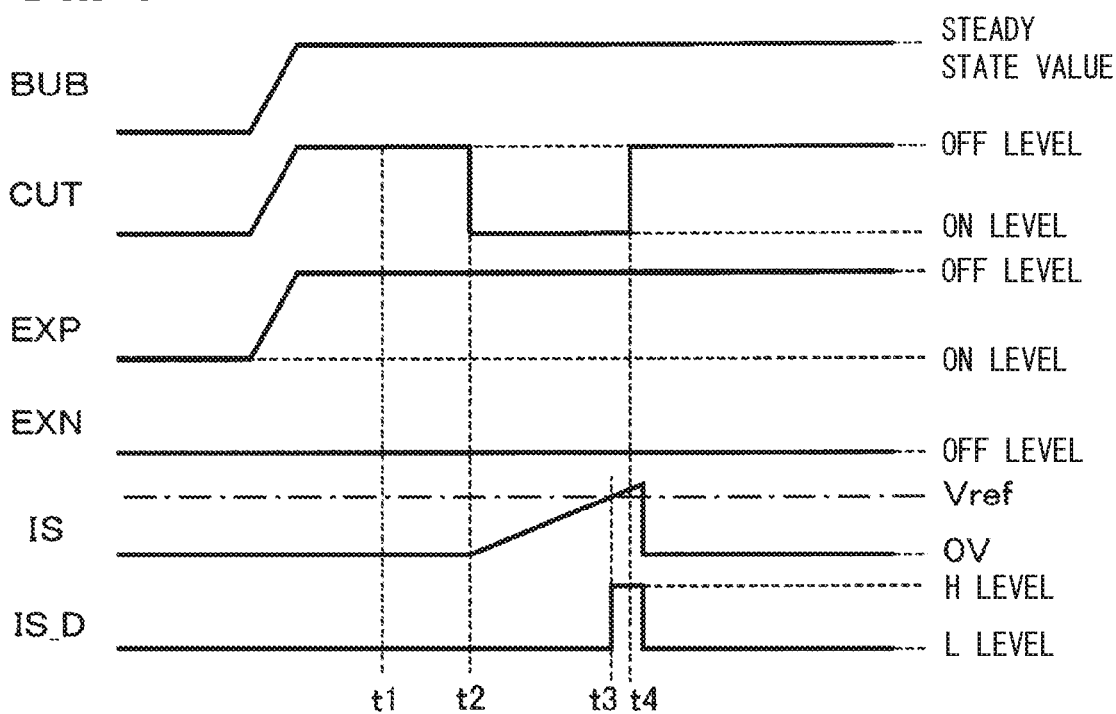
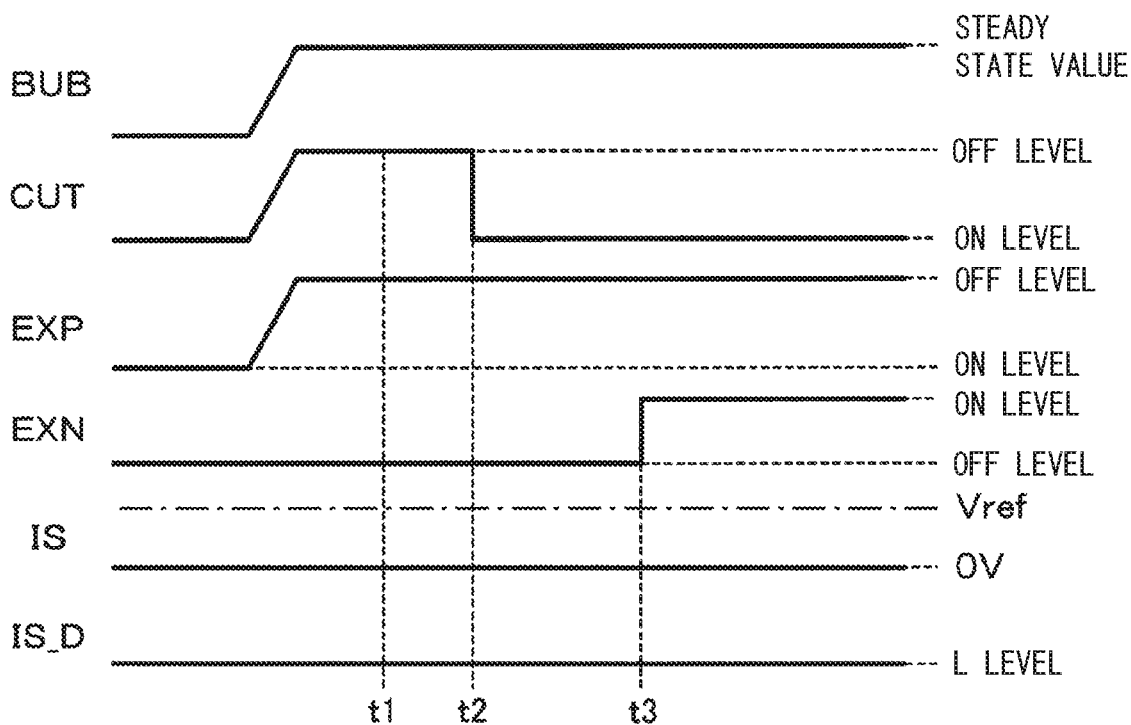

STEP-UP SWITCHING POWER SUPPLY CIRCUIT

CROSS REFERENCE TO RELATED APPLICATIONS

The present application is a continuation application of International Patent Application No. PCT/JP2018/041007 filed on Nov. 5, 2018, which designated the U.S. and claims the benefit of priority from Japanese Patent Application No. 2018-010547 filed on Jan. 25, 2018. The entire disclosures of all of the above applications are incorporated herein by reference.

TECHNICAL FIELD

The present disclosure relates to a step-up switching power supply circuit.

BACKGROUND

There has been known an electronic control device mounted on a vehicle and provided with a step-up switching power supply circuit. Hereinafter, the electronic control device may be also referred to as ECU, and the step-up switching power supply circuit may be also referred to as a step-up power supply.

SUMMARY

The present disclosure describes a step-up switching power supply circuit that executes a step-up operation for stepping up an input voltage supplied through an input terminal.

BRIEF DESCRIPTION OF DRAWINGS

The features and advantages of the present disclosure will become more apparent from the following detailed description made with reference to the accompanying drawings. In the drawings;

FIG. 3 is a diagram illustrating the operation of a power supply circuit in a normal state according to the first embodiment, and schematically showing a waveform of a signal of each part;

FIG. 4 is a diagram illustrating a specific setting example of a detection threshold according to the first embodiment, and schematically showing a generated current;

FIG. 5 is a diagram illustrating the operation of the power supply circuit when a short-circuit fault occurs according to the first embodiment, and schematically showing a waveform of a signal of each part;

FIG. 6 is a diagram illustrating the operation of the power supply circuit when an open-circuit fault occurs according to the first embodiment, and schematically showing a waveform of a signal of each part;

DETAILED DESCRIPTION

Figure 1:
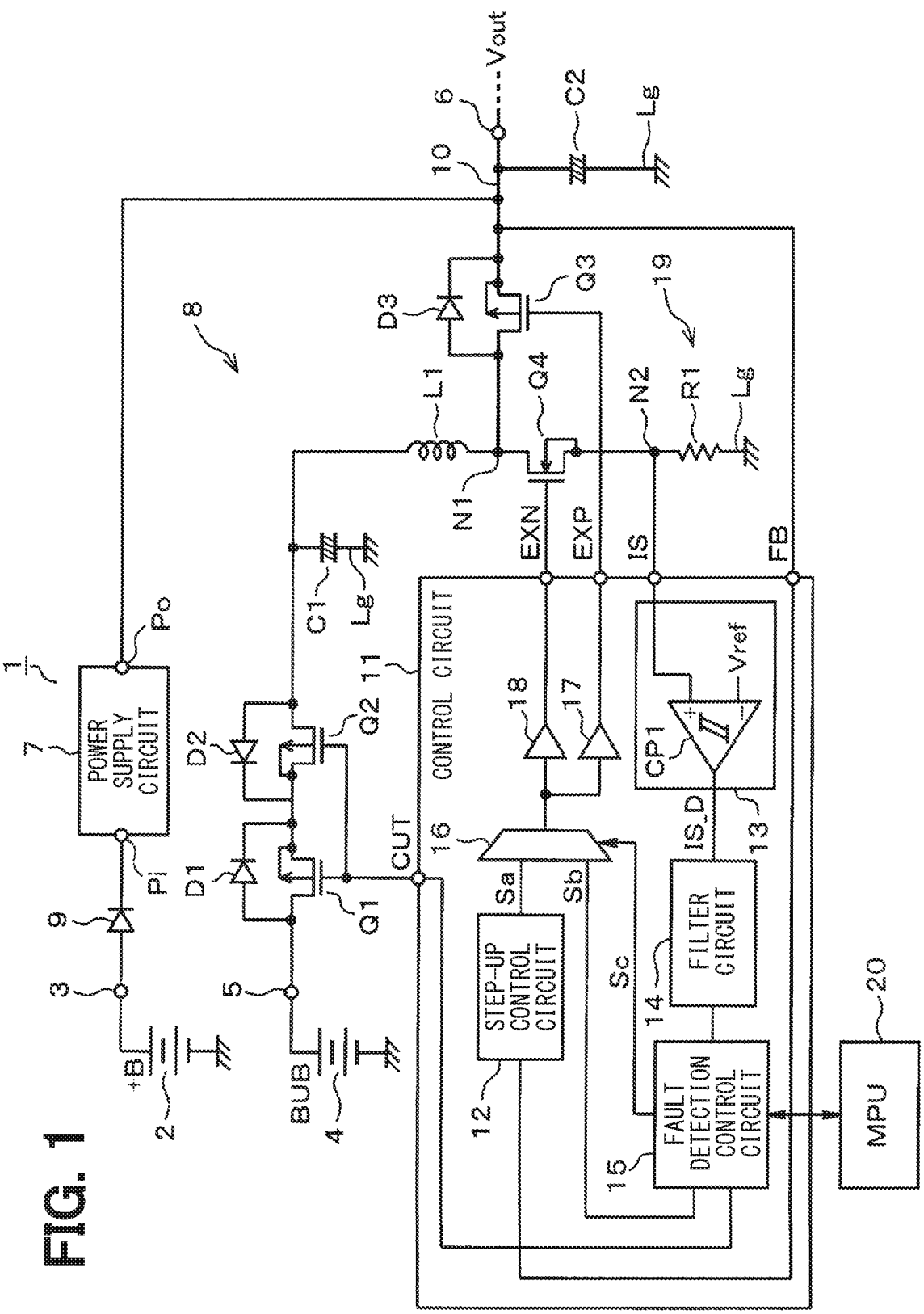
FIG. 1 is a diagram schematically showing a configuration of a power supply system according to a first embodiment.

For a functional safety of electronic products, it has been demanded that a function of self-checking whether a missing part or a fault has occurred in an actual operation after each discrete component including a step-up power supply mounted on an ECU has been shipped as a product.

When checking whether a fault occurs in the switching element such as a MOS transistor provided in a step-up power supply, there is a need to actually operate the step-up power supply. However, the step-up power supply provided in the ECU is often used so as to operate in an auxiliary manner when a battery voltage is temporarily lowered, for example, due to cranking. For that reason, when the other main power supply circuit is operating, since step-up power supply is no longer operated, it is difficult to confirm the above fault.

Therefore, a method is conceivable in which an output target value of the step-up power supply is intentionally increased so that the step-up power supply is forcibly operated even during the operation of the main power supply circuit. However, in order to adopt such a method, there is a need to significantly change and add a circuit of a feedback system, which causes another issue that a circuit scale is greatly increased.

According to an aspect of the present disclosure, a step-up switching power supply circuit executes a step-up operation for stepping up an input voltage supplied through an input terminal. The step-up switching power supply circuit includes an inductor, a switching element, a step-up control circuit, a fault detection control circuit, a current detection unit and a switching unit. The switching element enlarges a current flowing through the inductor when the switching element is turned on. The step-up control circuit controls driving of the switching element to execute the step-up operation. The fault detection control circuit controls the driving of the switching element to detect a fault of the switching element. The current detection unit detects a current flowing through the switching element. The switching unit executes switchover between the step-up control circuit and the fault detection control circuit to control the driving the switching element.

In the configuration described above, prior to the execution of the step-up operation, the switching unit executes switching so that the driving of the switching element is controlled by the fault detection control circuit. Then, the fault detection control circuit turns on the switching element, and detects the open-circuit fault of the switching element based on the detection result of the current by the current detection unit. In the configuration described above, if the switching element is in open-circuit fault, even if the switching element is turned on driven, the current flowing through the switching element is not increased. Therefore, in the detection of the open-circuit fault, for example, it may be determined that the switching element is in an open-circuit fault when the detection value of the current by the current detection unit does not reach a predetermined threshold.

With the configuration described above, the open-circuit fault of the switching element may be detected without execution of the actual step-up operation, A fault detection control circuit is added to the configuration of the conventional step-up switching power supply circuit, thereby being capable of detecting the open-circuit fault, and there is no need to add significant changes and additions to the circuit of the feedback system. Therefore, according to the above configuration, an excellent effect that the fault of the switching element may be detected is obtained without causing a significant increase in the circuit scale.

According to one aspect of the present disclosure, the step-up switching power supply circuit further includes a power on-off switch interposed in series in the power supply path leading from the input terminal to the inductor. The on and off of the power on-off switch is controlled by the fault detection control circuit, Prior to the execution of the step-up operation, the fault detection control circuit turns on the power on-off switch, detects a short-circuit fault of the switching element based on the detection result of the current by the current detection unit.

In the configuration described above, if the switching element is in the short-circuit fault, when the power on-off switch is turned on, in spite of the fact that the switching element is not turned on, the current flowing through the switching element is increased. For that reason, in the detection of the short-circuit fault, for example, when the detection value of the current by the current detection unit reaches a predetermined threshold, it may be determined that the switching element is in the short-circuit fault. With the above configuration, the short-circuit fault may be also detected in addition to the open-circuit fault of the switching element without execution of the actual step-up operation.

The following describes multiple embodiments with reference to the drawings. In the following respective embodiments, the use of the same reference numerals indicates similar, but not necessarily, the same or identical components, and repetitive description is omitted.

First Embodiment

The following describes a first embodiment with reference to FIGS. 1 to 6.

The power supply system 1 shown in FIG. 1 is used in a Data Communication Module mounted on a vehicle, that , a wireless communication ECU called a DCM.

A power supply system 1 is supplied with a voltage +B through an input terminal 3 from a vehicle battery 2 mounted on the vehicle, and also supplied with a voltage BUB through an input terminal 5 from a backup battery 4 mounted on the vehicle. Incidentally, the backup battery 4 is formed of, for example, a lithium ion battery. The power supply system 1 generates an output voltage Vout which becomes a power supply voltage of each configuration of the wireless communication ECU from the voltage +B or voltage BUB, and outputs the output voltage Vout through an output terminal 6. A target value of the output voltage Vout is, for example, +5 V.

The power supply system 1 includes two power supply circuits 7 and 8. The power supply circuit 7 is a step-down type DC/DC converter that steps down and outputs the voltage +B supplied from the vehicle battery 2. The power supply circuit 7 operates in a period in which the voltage +B is a voltage value in a range considered to be normal, that is, at a steady state, and is a main power supply circuit in the power supply system 1.

On the other hand, the power supply circuit 8 is a step-up switching power supply circuit that steps up and outputs the voltage BUB supplied from the backup battery 4. The power supply circuit 8 according to the present embodiment has a synchronous rectifier configuration. The power supply circuit 8 operates at an abnormal time such that the vehicle battery 2 is detached from the vehicle, when a voltage value of the voltage +B is lowered to less than a target value of the output voltage Vout, for example, by cranking or the like, and is an auxiliary power supply circuit in the power supply system 1.

An input terminal Pi of the power supply circuit 7 is connected to the input terminal 3 of the power supply system 1 through a diode 9 for blocking a backward flow in an opposite direction. An output terminal Po of the power supply circuit 7 is connected to a power supply line 10. The power supply line 10 is connected to the output terminal 6 of the power supply system 1. A target value of the output voltage of the power supply circuit 7 has the same value as the target value of the output voltage Vout of the power supply system 1 (for example, +5 V).

The power supply circuit 8 executes a step-up operation for stepping up the voltage BUB, which is an input voltage applied through the input terminal 5, and includes transistors Q1 to Q4, an inductor L1, capacitors C1 and C2, a resistor R1, a control circuit 11 and the like. The transistors Q1 and Q2 are both P-channel type MOS transistors. Body diodes D1 and D2, whose anodes are provided on a drain side of the transistors Q1 and Q2, are connected between drains and sources of the transistors Q1 and Q2, respectively.

The sources of the transistors Q1 and Q2 are connected in common to each other. The drain of the transistor Q1 is connected to the input terminal 5. The drain of the transistor Q2 is connected to a ground line Lg to which a ground potential (0 V) is given as a reference potential of the circuit through the capacitor C1. Further, the drain of the transistor Q2 is connected to a node N1 through an inductor L1. Each gate of the transistors Q1 and Q2 is given a drive signal CUT output from the control circuit 11. As a result, the driving of the transistors Q1 and Q2 is controlled by the control circuit 11.

The transistor Q3 is a P-channel MOS transistor, and a body diode D3, whose anode is provided on the drain side of the transistor Q3, is connected between the drain and the source of the transistor Q3. The drain of the transistor Q3 is connected to the node N1 and the source of the transistor Q3 is connected to a power supply line 10. The gate of the transistor Q3 is given a drive signal EXP output from the control circuit 11. As a result, the driving of the transistor Q3 is controlled by the control circuit 11. The capacitor C2 for smoothing the output voltage Vout is connected between the power supply line 10 and the ground line Lg.

The transistor Q4 is an N-channel MOS transistor, and a drain of the transistor Q4 is connected to the node N1. A source of the transistor Q4 is connected to the ground line Lg through a current detection resistor R1. A gate of the transistor Q4 is given a drive signal EXN output from the control circuit 11. As a result, the driving of the transistor Q4 is controlled by the control circuit 11.

A voltage of a node N2, which is an interconnection point of the transistor Q4 and the resistor R1, is input to the control circuit 11 as a current detection signal IS, which is a voltage signal corresponding to a current flowing through the transistor Q4. Further, a voltage itself of the power supply line 10, or a voltage obtained by dividing the voltage of the power supply line 10 is input to the control circuit 11 as a voltage detection signal FB, which is a voltage signal corresponding to the output voltage Vout. The control circuit 11 executes a feedback control so that the output voltage Vout coincides with a target value based on the voltage detection signal FB.

In the configuration described above, the transistors Q1 and Q2 correspond to a power on-off switch interposed in series in a power supply path extending from the input terminal 5 to the inductor L1. The power on-off switch may also be called as an electrical conduction switch. Further, in the configuration described above, the transistor Q4 corresponds to a switching element that is turned on to increase or enlarge a current flowing through the inductor L1. Furthermore, in the configuration described above, the resistor R1 corresponds to a shunt resistor provided so as to be interposed in series between the switching element and the ground.

The transistors Q1 and Q2 are connected in series between the input terminal 5 and the inductor L1 so that the respective body diodes D1 and D2 are opposite to each other. According to the configuration described above, when the transistors Q1 and Q2 are turned off, a current is also prevented from flowing through the body diodes D1 and D2, so that the power supply path extending from the input terminal 5 to the inductor L1 may be completely shut off.

The control circuit 11 is configured by, for example, an application specific integrated circuit, that is, an ASIC. The control circuit 11 includes a step-up control circuit 12, a detection circuit 13, a filter circuit 14, a fault detection control circuit 15, a selector 16, and pre-drivers 17 and 18. Although not shown, the control circuit 11 is supplied with the voltage generated based on the voltage BUB or the voltage BUB as a power supply voltage. The control circuit 11 is configured to operate upon receiving the supply of the power supply voltage described above.

The step-up control circuit 12 controls the driving of the transistors Q3 and Q4 to execute step-up operation, and is configured by, for example, a logic circuit. The step-up control circuit 12 generates and outputs a control signal Sa for controlling the driving of the transistors Q3 and Q4 based on the voltage detection signal FB.

One of the transistors Q3 and Q4 is turned on while the other transistor is turned off, that is, the transistors Q3 and Q4 are complementarily turned on and off. The term "complementarily turned on and off" does not exclude a situation in which a period in which both the switches are turned off, a so-called dead time is provided. The control signal Sa output from the step-up control circuit 12 is input to one of input terminals of the selector 16.

The detection circuit 13 detects a current flowing through the transistor Q4 based on a terminal voltage of the resistor R1, and includes a comparator CP1 with hysteresis. The current detection signal IS input to a non-inverting input terminal of the comparator CP1, and a reference voltage Vref is input to an inverting input terminal of the comparator CP1. The reference voltage Vref is generated by a reference voltage generation circuit (not shown), and is a voltage corresponding to a detection threshold of the current flowing through the transistor Q4. The detection threshold is used for fault detection of the transistor Q4.

According to the configuration described above, an output signal IS_D of the comparator CP1 becomes a low-level (for example, 0 V) when the current detection signal IS falls below the reference voltage Vref, and becomes a high-level (for example, +5 V) when the current detection signal IS exceeds the reference voltage Vref. Hereinafter, the low-level is referred to as an L level, and the high-level is referred to as an H level. The resistor R1 and the detection circuit 13 configure a current detection unit 19 for detecting a current flowing through the transistor Q4.

The filter circuit 14 is, for example, a low-pass filter, and receives an output signal IS_D of the comparator CP1, and outputs a signal obtained by removing noise from the input signal. The output signal of the filter circuit 14 is input to the fault detection control circuit 15. The fault detection control circuit 15 controls the driving of the transistors Q3 and Q4 to detect a fault of the transistor Q4, and is configured by, for example, a logic circuit. Although the details will be described later, the fault detection control circuit 15 detects a fault of the transistor Q4 based on the output signal of the filter circuit 14 representing the detection result of the current by the current detection unit 19.

The fault detection control circuit 15 generates a drive signal CUT for driving the transistors Q1 and Q2, and outputs the drive signal CUT to the gates of the transistors Q1 and Q2. In other words, the on and off of the transistors Q1 and Q2 are controlled by the fault detection control circuit 15. The fault detection control circuit 15 generates and outputs a control signal Sb for controlling the driving of the transistors Q3 and Q4. The control signal Sb output from the fault detection control circuit 15 is input to the other input terminal of the selector 16.

The fault detection control circuit 15 further generates a switching signal Sc for controlling the switching operation by the selector 16, and outputs the switching signal Sc to the selector 16. In this situation, the fault detection control circuit 15 can execute a communication with the external control device 20. The control device 20 is mainly configured by a microprocessor unit, that is, an MPU. The fault detection control circuit 15 executes a communication with the control device 20 when detecting a fault of the transistor Q4.

The selector 16 executes a switching operation of outputting one of the control signals Sa and Sb to be received based on the switching signal Sc. The output signal of selector 16 is provided to pre-drivers 17 and 18. The selector 16 corresponds to a switching unit that executes a switching operation so that one of the step-up control circuit 12 and the fault detection control circuit 15 can control the driving of the transistors Q3 and Q4. Note that, in the present disclosure, one of the control signals Sa and Sb means either the control signal Sa or the control signal Sb, and one of the step-up control circuit 12 and the fault detection control circuit 15 means either the step-up control circuit 12 or the fault detection circuit 15.

The pre-driver 17 generates a drive signal EXP for driving the transistor Q3 based on the output signal of the selector 16, and outputs the drive signal EXP to the gate of the transistor Q3. The pre-driver 18 generates a drive signal EXN for driving the transistor Q4 based on the output signal of the selector 16, and outputs the drive signal EXN to the gate of the transistor Q4.

The following describes the operation of the above configuration.

[1] Fault Detection Process

In the power supply circuit 8, prior to the execution of the step-up operation by the step-up control circuit 12, a fault detection process, which is a process for detecting a fault of the transistor Q4, is executed. More specifically, in the power supply circuit 8, for example, a fault detection process is executed at the time of startup. The startup time is a time when the power is turned on, that is, a time when the supply of the voltage BUB to the power supply circuit 8 is started.

Figure 2:
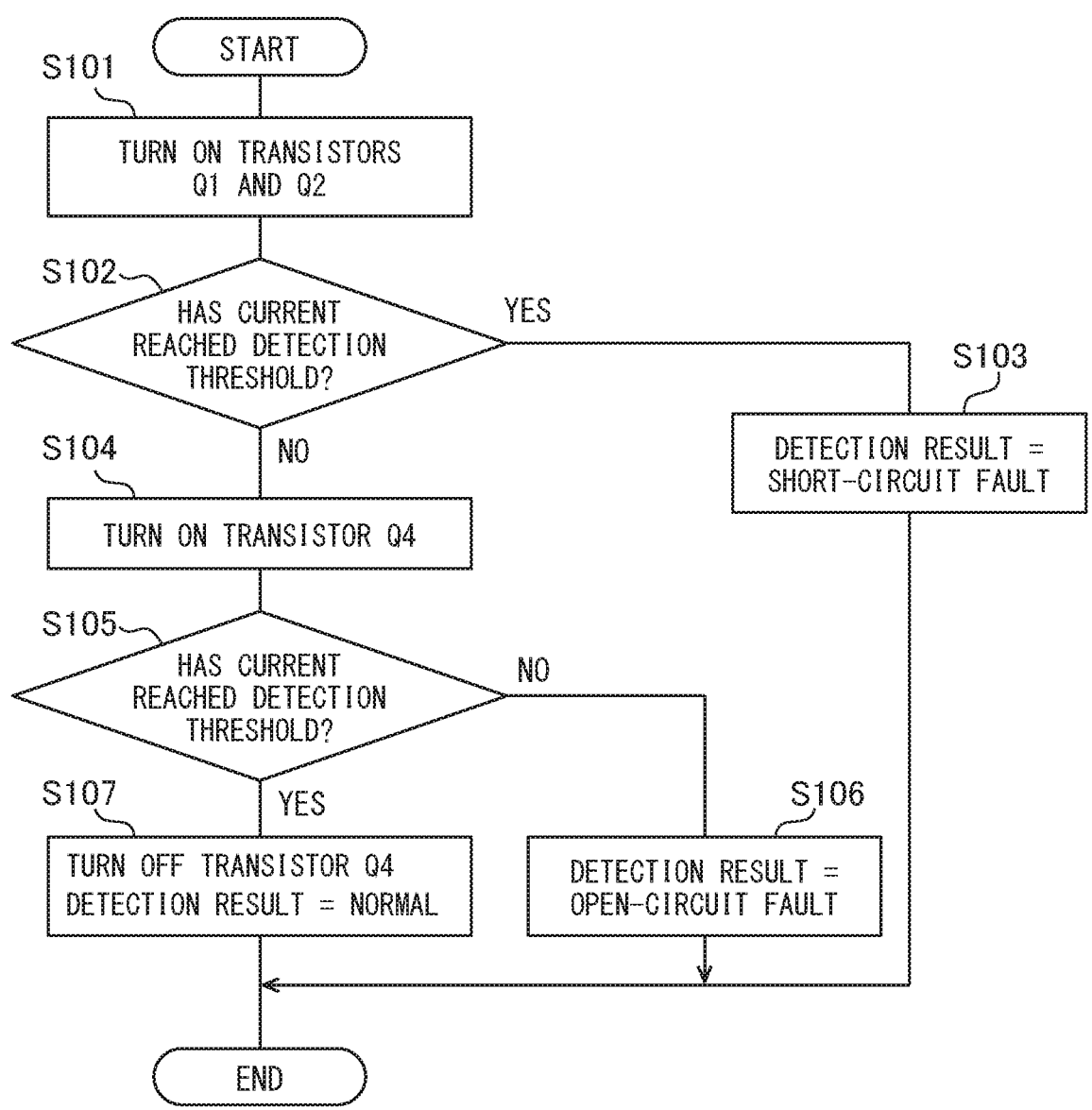
FIG. 2 is a diagram schematically showing the content of a fault detection process according to the first embodiment.

The fault detection process is executed mainly by the fault detection control circuit 15, and a specific content of the fault detection process is, for example, shown in FIG. 2. The operation of the selector 16 is controlled at any point of time before the fault detection process is started so that the control signal Sb is output from the selector 16, that is, so that the driving of the transistors Q3 and Q4 is controlled by the fault detection control circuit 15.

As shown in FIG. 2, when the fault detection process is started, S101 is initially executed. In S101, transistors Q1 and Q2 are turned on. At this point, the transistors Q3 and Q4 are turned off. In the subsequent S102, it is determined whether a current flowing through the transistor Q4 has reached a detection threshold based on the output signal of the filter circuit 14.

In this situation, when the current flowing through the transistor Q4 reaches the detection threshold, a determination of "YES" is made in S102, and the process proceeds to S103. Even though the transistor Q4 is turned off, a current flows through the transistor Q4. Therefore, in S103, it is detected that a short-circuit fault occurs in the transistor Q4, and as a detection result by the present fault detection process, a "short-circuit fault" is stored. After S103 has been executed, the fault detection process is completed.

Since it is detected in the fault detection process that the transistor Q4 is in the short-circuit fault, after the end of the fault detection process, the execution of the step-up operation by the step-up control circuit 12 is prohibited while the processing at the time of the fault detection is executed. As the processing at the time of the fault detection, for example, a process of notifying the control device 20 that the transistor Q4 is in fault may be exemplified.

If the current flowing through the transistor Q4 does not reach the detection threshold, a determination of "NO" is made in S102, and the process proceeds to S104. In S104, transistor Q4 is turned on. In the subsequent S105, it is determined whether the current flowing through the transistor Q4 has reached the detection threshold based on the output signal of the filter circuit 14.

When the current flowing through the transistor Q4 does not reach the detection threshold, a determination of "NO" is made in S105, and the process proceeds to S106. Even though the transistor Q4 is turned on, a current does not flow through the transistor Q4. Therefore, in S106, it is detected that an open-circuit fault occurs in the transistor Q4, and as a detection result by the present fault detection process, an "open-circuit fault" is stored.

After S106 has been executed, the fault detection process is completed. Since it is detected in the fault detection process that the transistor Q4 is in the open-circuit fault, after the end of the fault detection process, the execution of the step-up operation by the step-up control circuit 12 is prohibited while the processing at the time of the fault detection is executed.

When the current flowing through the transistor Q4 reaches the detection threshold, a determination of "YES" is made in S105, and the process proceeds to S107. It may be considered that neither the short-circuit fault nor the open-circuit fault occurs in the transistor Q4. Therefore, in S107, it is detected that the transistor Q4 is normal, and the "normal" is stored as a detection result by the present fault detection process.

Further, in S107, the transistor Q4 is turned off. After S107 has been executed, the fault detection process is completed. Since the transistor Q4 is detected to be normal in the fault detection process, after the completion of the fault detection process, the execution of the step-up operation by the step-up control circuit 12 is allowed.

In the power supply circuit 8, prior to the execution of the step-up operation by the step-up control circuit 12, the fault detection control circuit 15 controls the operation of the selector 16 so that the driving of the transistors Q3 and Q4 is controlled by the fault detection control circuit 15. Then, the fault detection control circuit 15 turns on the transistor Q4, and detects the open-circuit fault of the transistor Q4 based on the detection result of the current by the current detection unit 19.

In the power supply circuit 8, prior to the execution of the step-up operation by the step-up control circuit 12, the fault detection control circuit 15 turns on the transistors Q1 and Q2, and detects the short-circuit fault of the transistor Q4 based on the detection result of the current by the current detection unit 19. However, prior to the detection of an open-circuit fault of the transistor Q4, the fault detection control circuit 15 detects the short-circuit fault of the transistor Q4.

[2] Normal Operation

The following describes the operation of the power supply circuit 8 in the normal state in which no fault occurs in the transistor Q4 with reference to FIG. 3. In FIG. 3 and the like, the current detection signal IS shown as a waveform that rises relatively slowly for illustration, but actually has a signal waveform that rises more steeply.

As shown in FIG. 3, when the voltage BUB rises to a steady-state value, the control circuit 11 starts operating normally. At this time, the drive signals CUT and EXP are at an OFF level, which is a voltage value comparable to that of the voltage BUB, and thus turn off the transistors Q1 to Q3. Further, the drive signal EXN is at an OFF level, which is a voltage value comparable to the ground potential (0V), to turn off the transistor Q4.

At any time t1 during a period in which the above state is maintained, the switching operation of the selector 16 is executed so that the driving of the transistors Q3 and Q4 is controlled by the fault detection control circuit 15. At a time t2, the fault detection control circuit 15 turns the level of the drive signal CUT to the ON level, which is a voltage value comparable to the ground potential (0V), to turn on the transistors Q1 and Q2.

Since the transistor Q4 is normal and turned off, no current flows through the transistor Q4. For that reason, the current detection signal IS does not rise from the ground potential (0V), as a result of which the output signal IS_D remains at the L level. Therefore, it may be determined that a short-circuit fault has not occurred in the transistor Q4.

At a time t3, the fault detection control circuit 15 turns the level of the drive signal EXN to the ON level, which is a voltage value comparable to the power supply voltage (for example, voltage BUB), to turn on the transistor Q4. Since the transistor Q4 is normal and turned on, a current flows through the transistor Q4, and the current detection signal IS rises accordingly.

At a time when the current detection signal IS reaches the reference voltage Vref, that is, at a time t4 when the current flowing through the transistor Q4 reaches the detection threshold, the output signal IS_D turns to the H level. Therefore, it may be determined that an open-circuit fault has not occurred in the transistor Q4.

When detecting that the output signal IS_D has been turned to the H level on the basis of the output signal of the filter circuit 14, the fault detection control circuit 15 turns the drive signal EXN to the OFF level, and thus turn off the transistor Q4. In this situation, if the transistor Q4 is not immediately turned off, there is a possibility that an excessive current flows through the transistor Q4. For that reason, the fault detection control circuit 15 controls the transistor Q4 to be turned off immediately after the above detection.

However, until the transistor Q4 is actually turned off from the above detection, there is a delay time due to the circuit operation or the like. The fault detection control circuit 15 is configured as a logic circuit, and executes operation in synchronization with a clock signal. Therefore, the delay time will also include a delay associated with a clock synchronization in the fault detection control circuit 15. When the detection threshold is set by ignoring such a delay time, an excessive current flows until the transistor Q4 is actually turned off from the detection, resulting in a possibility that the transistor Q4 is in fault.

In the present embodiment, in consideration of such a delay time, the detection threshold is set so that the current flowing through the transistor Q4 is reduced below a rated current of the transistor Q4. The following describes an example of setting the detection threshold with reference to FIG. 4. The delay time is 1.5 μs, and the rated current of the transistor Q4 is 6 A.

In addition, the backup battery 4 is a secondary battery such as a lithium ion battery, and the steady-state value of the voltage BUB is +3.6 V. An inductance value of the inductor L1 is 2.2 μH. Furthermore, the specifications for a resistance of each element configuring the power supply circuit 8 are as follows.

On-resistance of transistor Q1: 25 mΩ
On-resistance of transistor Q2: 25 mΩ
Equivalent series resistance of inductor L1: 34 mΩ
On-resistance of transistor Q4: 19 mΩ
Resistance values of resistor R1: 33 mΩ
Parasitic resistance of circuit board, etc.: 50 mΩ

Therefore, a resistance value of a path extending from the input terminal 5 to the ground line Lg is 186 mΩ.

In the power supply circuit 8, immediately after the transistor Q4 has been turned on, a current determined according to a voltage value of the voltage BUB, a resistance value of the path extending from the input terminal 5 to the ground line Lg, an inductance value of the inductor L1, and so on flows through the transistor Q4. Hereinafter, the current flowing into the transistor Q4 is referred to as a generated current. As shown in FIG. 4, the generated current increases in proportion to an elapsed time from a time when the transistor Q4 is turned on.

In the present embodiment, the detection threshold is set to 1.26 A. In order to set the detection threshold to 1.26 A, the reference voltage Vref may be 42 mV. As shown in FIG. 4, the generated current reaches 1.26 A after about 0.8 μs from the time when the transistor Q4 is turned on, As a result, the current detection signal IS reaches the reference voltage Vref and the output signal IS_D of the comparator CP1 is inverted.

After the delay time (1.5 μs) has elapsed, that is, approximately 2.3 μs after transistor Q4 is turned on, the transistor Q4 is turned off. At that time, the generated current is 3.49 A and is reduced to a current sufficiently lower than 6 A, which is the rated current of the transistor Q4. Therefore, according to the configuration described above, in the fault detection process, a current exceeding the rated current does not flow through the transistor Q4.

[3] Operation at the Time of Short-Circuit Fault

The operation of the power supply circuit 8 at the time of a short-circuit fault occurrence in which the short-circuit fault occurs in the transistor Q4 will be described with reference to FIG. 5. The operation at the time when the transistors Q1 and Q2 are turned on, that is, up to the time t2 is the same as the normal operation. However, the transistor Q4 is short-circuited. For that reason, a current flows through the transistor Q4 immediately when the transistors Q1 and Q2 are turned on, and the current detection signal IS rises accordingly.

At a time t3 when the current detection signal IS reaches the reference voltage Vref, that is, when the current flowing through the transistor Q4 reaches the detection threshold, the output signal IS_D turns to the H level. Therefore, it may be determined that a short-circuit fault has occurred in the transistor Q4.

When detecting that the output signal IS_D has been turned to the H level on the basis of the output signal of the filter circuit 14, the fault detection control circuit 15 turns the drive signal CUT to the OFF level, thereby turning off the transistors Q1 and Q2. This prevents an excessive current from flowing through the transistor Q4 which has been in the short-circuit fault.

[4] Operation at the Time of Open-Circuit Fault

The following describes the operation of the power supply circuit 8 at the time of an open-circuit fault occurrence in which the open-circuit fault occurs in the transistor Q4 with reference to FIG. 6. The operation at the time when the transistor Q4 is turned on, that is, up to the time t3 is the same as the normal operation. However, since the transistor Q4 is in the open-circuit fault, even if the transistor Q4 is turned on, no current flows through the transistor Q4.

For that reason, the current detection signal IS does not rise from the ground potential (0 V), as a result of which the output signal IS_D remains at the L level. Therefore, it may be determined that an open-circuit fault has occurred in the transistor Q4. After the detection of the open-circuit fault in this way has been completed, it may be needed to turn off the transistor Q4. This is because, when the transistor Q4 is continued to turn on, if the transistor Q4 suddenly returns to normal, an excessive current may flow.

In the present embodiment, the fault detection control circuit 15 continues to turn on the transistor Q4 until receiving from the external control device 20 an instruction for turning off the transistor Q4, and turns off the transistor Q4 upon receiving the above instruction. As a result, after a predetermined time has elapsed since the detection of the open-circuit fault is completed, the transistor Q4 is turned off.

According to the present embodiment described above, the following advantageous effects may be obtained.

In the power supply circuit 8, prior to the execution of the step-up operation by the step-up control circuit 12, the switching operation of the selector 16 is executed so that the driving of the transistors Q3 and Q4 is controlled by the fault detection control circuit 15. Then, the fault detection control circuit 15 turns on the transistor Q4, and detects the open-circuit fault of the transistor Q4 based on the detection result of the current by the current detection unit 19. In the power supply circuit 8, if the transistor Q4 is in the open-circuit fault, even if the transistor Q4 is turned on, the current flowing through the transistor Q4 is not increased. For that reason, in the detection of the open-circuit fault, it may be determined that the transistor Q4 is in the open-circuit fault when the current flowing through the transistor Q4 does not reach a predetermined detection threshold.

With the configuration described above, the open-circuit fault of the transistor Q4 may be detected without execution of the actual step-up operation. The fault detection control circuit 15 configured as a logic circuit is added to the configuration of the conventional step-up switching power supply circuit, thereby being capable of detecting the open-circuit fault, and there is no need to add significant changes and additions to the circuit of the feedback system. Therefore, according to the present embodiment, an excellent effect that the fault of the transistor Q4 may be detected is obtained without causing a significant increase in the circuit scale.

The power supply circuit 8 includes the transistors Q1 and Q2 disposed in series with the power supply path extending from the input terminal 5 to the inductor L1, and the on and off of the transistors Q1 and Q2 are controlled by the fault detection control circuit 15. Prior to the execution of the step-up operation, the fault detection control circuit 15 turns on the transistors Q1 and Q2, and detects the short-circuit fault of the transistor Q4 based on the detection result of the current by the current detection unit 19.

In the power supply circuit 8, if the transistor Q4 is in the short-circuit fault, when the transistors Q1 and Q2 are turned on, the current flowing through the transistor Q4 is increased even though the transistor Q4 is not turned on. For that reason, in the detection of the short-circuit fault, it may be determined that the transistor Q4 is in the short-circuit fault when the current flowing through the transistor Q4 reaches the predetermined detection threshold. With the above configuration, the short-circuit fault may be also detected in addition to the open-circuit fault of the transistor Q4 without execution of the actual step-up operation.

The transistor Q4 is disposed in series between the input terminal 5, which is applied with the voltage BUB, and the ground line Lg. For that reason, if the transistor Q4 is in the short-circuit fault, an excessive short-circuit current may flow. On the other hand, when the transistor Q4 is in the open-circuit fault, although the step-up operation cannot be executed, there is no possibility that an excessive short-circuit current flows. Therefore, in the present embodiment, prior to the detection of the open-circuit fault of the transistor Q4, the fault detection control circuit 15 detects the short-circuit fault of the transistor Q4. With the above configuration, the detection of the short-circuit fault that may be more complicated in the situation of occurrence of a fault may be preferentially executed, thereby being capable of improving the safety.

According to the configuration of the present embodiment, the short-circuit fault of the transistor Q3 may be detected as follows. In other words, prior to the execution of the step-up operation by the step-up control circuit 12, the fault detection control circuit 15 turns on the transistors Q1 and Q2, and also turns off the transistors Q3 and Q4. In this state, the control device 20 monitors the current detection signal FB through a communication.

If the transistor Q3 is normal, the current detection signal FB is fixed to the low-level (0V). When the transistor Q3 is in the short-circuit fault, the current detection signal FB reaches a level close to the voltage value of the voltage BUB. In consideration of the above point, the control device 20 can detect a short-circuit fault of the transistor Q3 based on the level of the current detection signal FB monitored as described above. The detection of the short-circuit fault of the transistor Q3 may not necessarily be executed by the control device 20, but may be executed by the control circuit 11.

Second Embodiment

Figure 7:
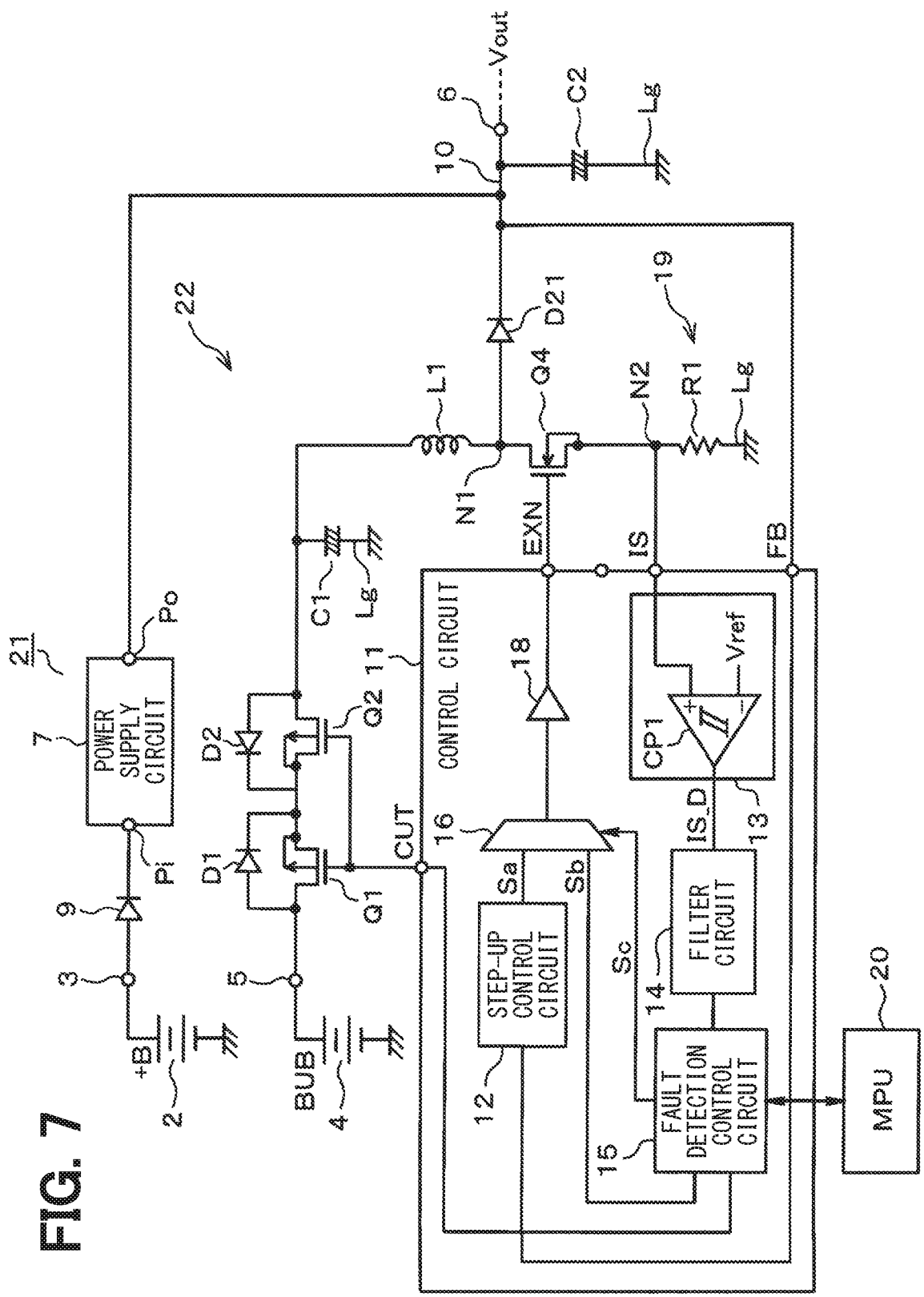
FIG. 7 is a diagram schematically showing a configuration of a power supply system according to a second embodiment.

The following describes a second embodiment with reference to FIG. 7.

As shown in FIG. 7, a power supply circuit 22 provided in a power supply system 21 according to the present embodiment is a step-up switching power supply circuit similar to the power supply circuit 8 according to the first embodiment. However, the power supply circuit 22 is different from the power supply circuit 8 in a configuration of a diode rectifier having a diode D21 in place of the transistor Q3.

An anode of the diode D21 is connected to a node N1, and a cathode of the diode D21 is connected to a power supply line 10. Even with the power supply circuit 22 having the configuration of the above diode rectifier, the same fault detection as that in the first embodiment may be executed. Therefore, the present embodiment has the similar advantageous effects as those of the first embodiment.

Third Embodiment

Figure 8:
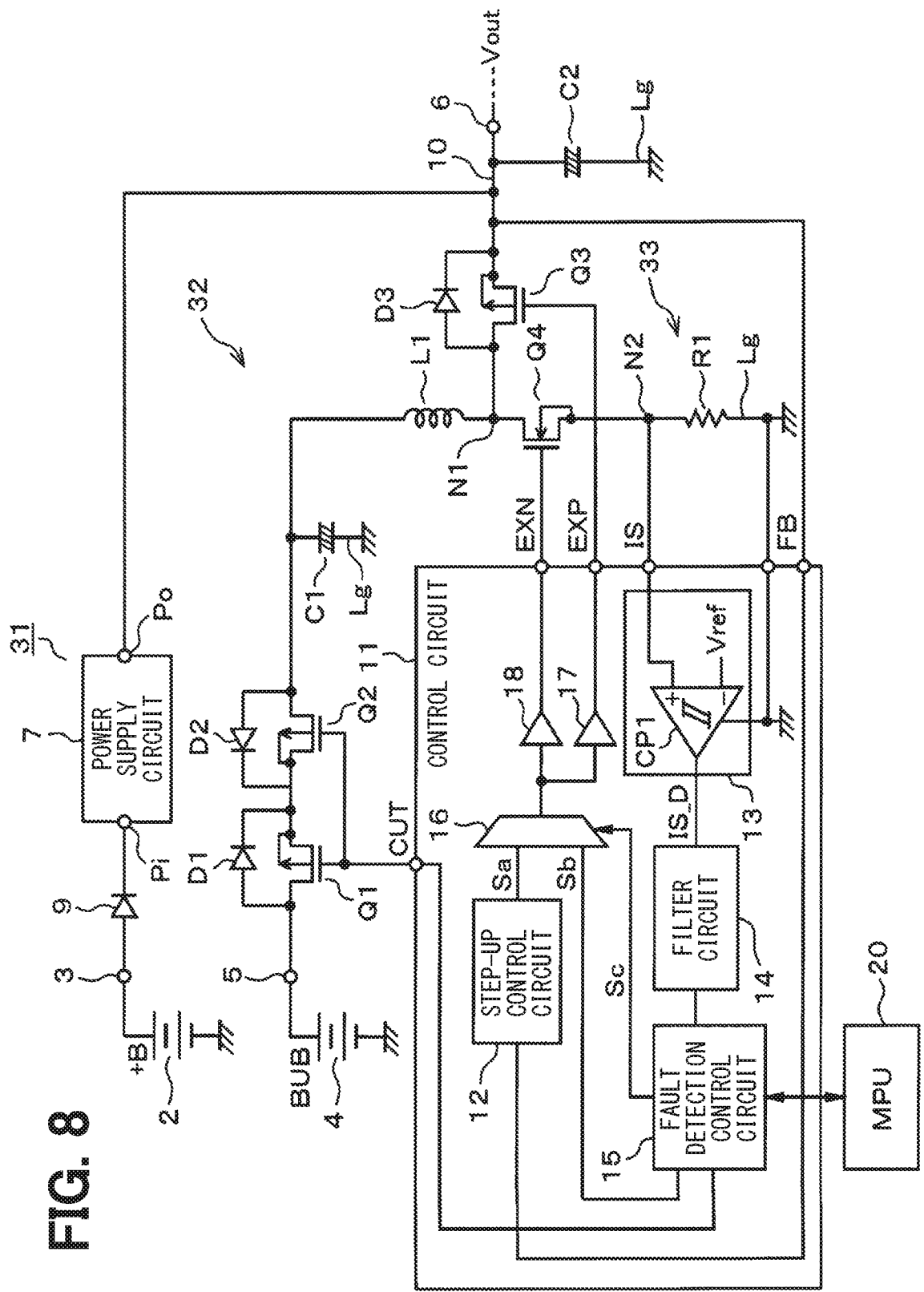
FIG. 8 is a diagram schematically showing a configuration of a power supply system according to a third embodiment.

The following describes a third embodiment with reference to FIG. 8.

As shown in FIG. 8, a power supply circuit 32 provided in a power supply system 31 according to the present embodiment is a step-up switching power supply circuit similar to the power supply circuit 8 according to the first embodiment. However, the power supply circuit 32 is different from the power supply circuit 8 in that a current detection unit 33 is provided in place of the current detection unit 19. The current detection unit 33 has the same configuration as that of the current detection unit 19, that is, a resistor R1 and a detection circuit 13, However, a comparator CP1 of the detection circuit 13 operates with the ground, which is a potential of a low potential side of the resistor R1 as a reference potential.

According to the present embodiment described above, since the same fault detection as that of the first embodiment may be executed, the same effects as those of the first embodiment may be obtained. Further, in the present embodiment, the ground in the current detection unit 33 is shared. In other words, since the ground of the resistor R1 side and the ground of the detection circuit 13 side are common to each other, there is no error in current detection due to a potential difference of the ground. Therefore, according to the present embodiment, the accuracy of the current detection may be improved, as a result of which the accuracy of the fault detection may be enhanced.

Fourth Embodiment

Figure 9:
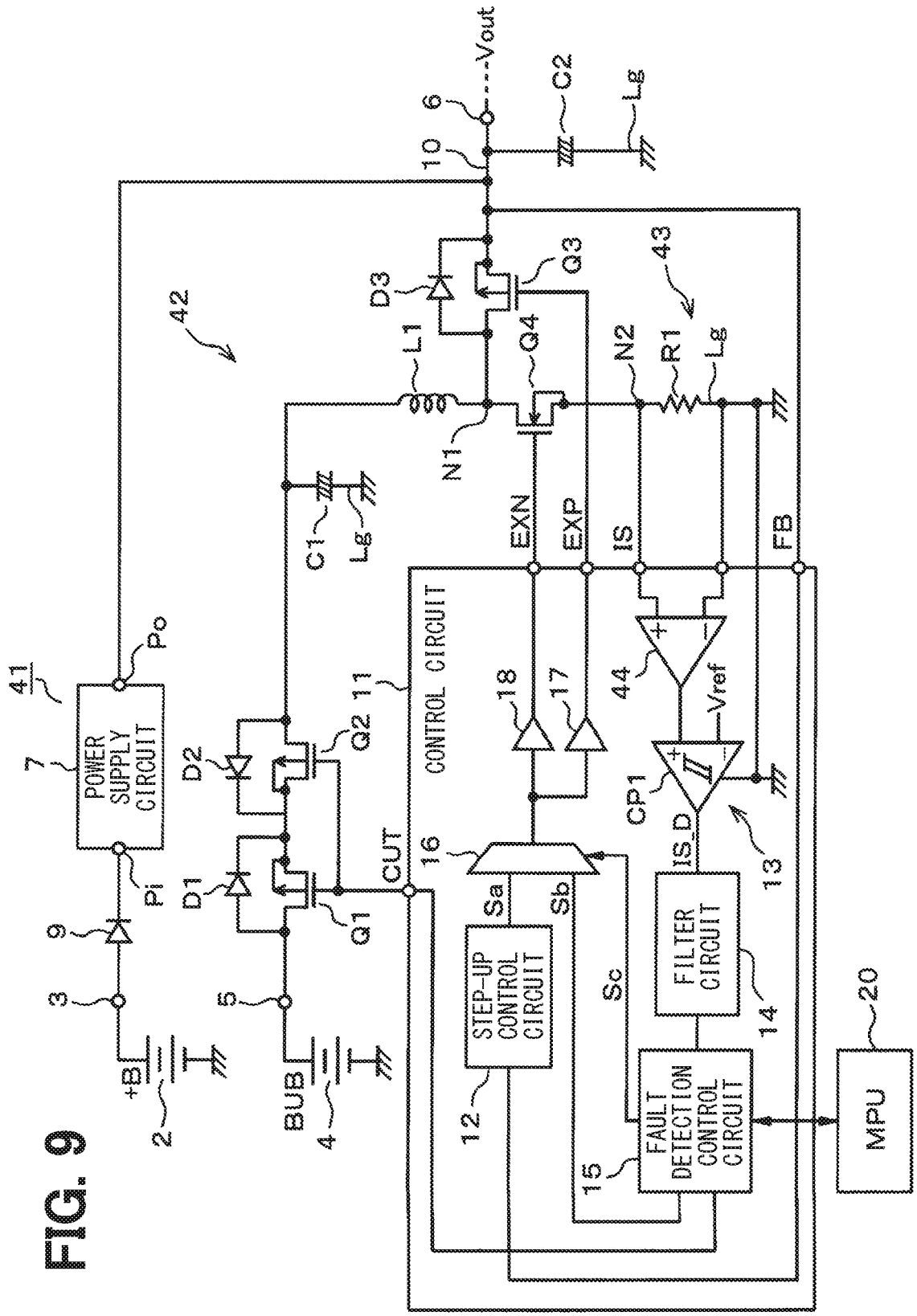
FIG. 9 is a diagram schematically showing a configuration of a power supply system according to a fourth embodiment.

The following describes a fourth embodiment with reference to FIG. 9.

As shown in FIG. 9, a power supply circuit 42 provided in a power supply system 41 according to the present embodiment is a step-up switching power supply circuit similar to the power supply circuit 32 according to the third embodiment. However, the power supply circuit 42 is different from the power supply circuit 32 in that a current detection unit 43 is provided in place of the current detection unit 33.

The current detection unit 43 includes an amplifier circuit 44 in addition to a configuration similar to that of the current detection unit 33. The amplifier circuit 44 is a differential amplifier whose non-inverting input terminal receives a current detection signal IS. An inverting input terminal of the amplifier circuit 44A receives a signal corresponding to the potential of the ground line Lg. With the configuration described above, the amplifier circuit 44 amplifies and outputs a terminal voltage of the resistor R1. A non-inverting input terminal of the comparator CP1 receives an output signal of the amplifier circuit 44.

According to the present embodiment described above, since the same fault detection as that of the first embodiment may be executed, the same effects as those of the first embodiment may be obtained. Furthermore, in the present embodiment, an amplifier circuit 44 for amplifying the terminal voltage of the resistor R1 is provided, and it is determined whether or not the current flowing through the transistor Q4 has reached a detection threshold by use of an output signal of the amplifier circuit 44. With the configuration described above, a resistance value of the resistor R1 may be further reduced, advantages such as a loss reduction in the power supply circuit 42, an efficiency improvement, and so on may be obtained.

Fifth Embodiment

Figure 10:
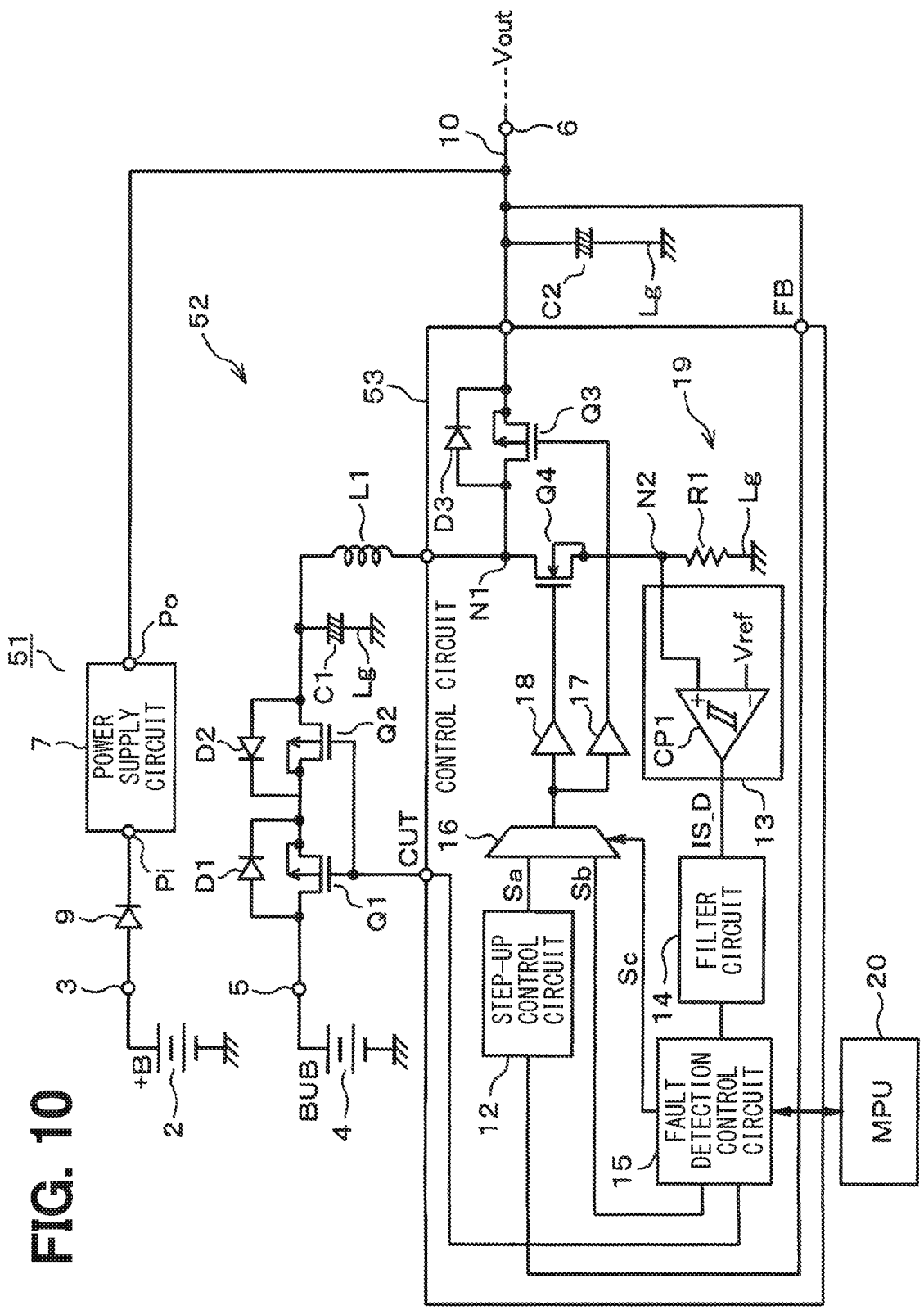
FIG. 10 is a diagram schematically showing a configuration of a power supply system according to a fifth embodiment.

The following describes a fifth embodiment with reference to FIG. 10.

As shown in FIG. 8, a power supply circuit 52 provided in a power supply system 51 according to the present embodiment is different from the power supply circuit 8 according to the first embodiment in that a control circuit 53 is provided in place of the control circuit 11. The control circuit 53 includes transistors Q3 and Q4 and a resistor R1 in addition to the same configuration as that of the control circuit 11.

In other words, in the power supply circuit 52, the transistors Q3 and Q4 and the resistor R1 are incorporated in a control circuit 53 configured as an ASIC. Even in the power supply circuit 52 of the configuration in which the transistors Q3 and Q4, and so on are incorporated in the control circuit 53, the same fault detection as in the first embodiment may be executed. Therefore, the present embodiment has the same advantageous effects as those of the first embodiment.

Sixth Embodiment

Figure 11:
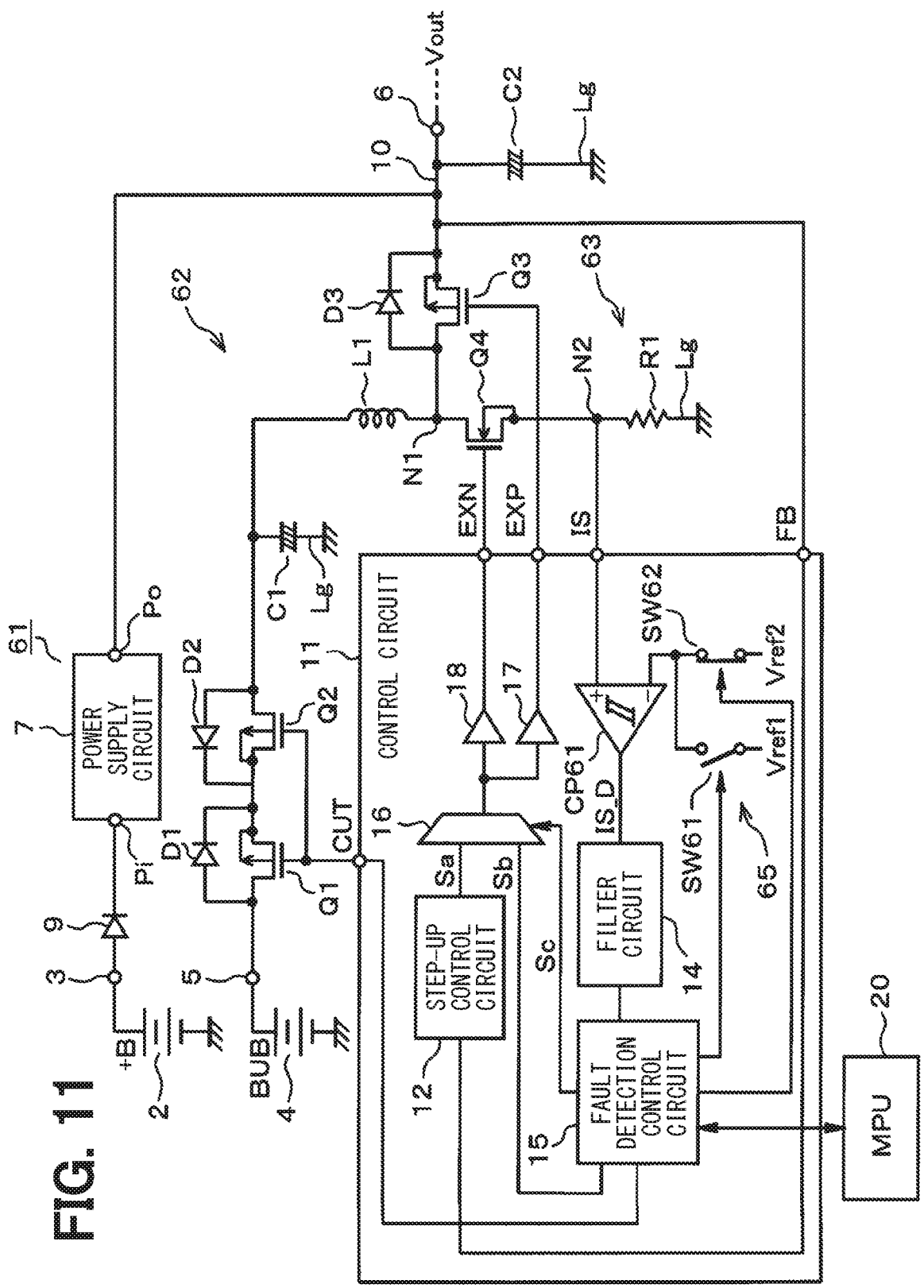
FIG. 11 is a diagram schematically showing a configuration of a power supply system according to a sixth embodiment.

The following describes a sixth embodiment with reference to FIG. 11.

A step-up switching power supply circuit may include an overcurrent detection circuit for detecting that an excessive current exceeding an overcurrent determination threshold flows into a switching element that turns on to increase the current flowing through an inductor. At least a portion of the configuration of the overcurrent detection circuit described above is shared, thereby being capable of configuring a current detection unit for detecting a current flowing through a transistor Q4.

In the present embodiment, the comparator provided in the overcurrent detection circuit described above is shared, to thereby configure a current detection unit for detecting a current flowing through the transistor Q4. As shown in FIG. 11, a power supply circuit 62 provided in a power supply system 61 according to the present embodiment is different from the power supply circuit 8 according to the first embodiment in that a current detection unit 63 is provided in place of the current detection unit 19 and a fault detection control circuit 64 is provided in place of the fault detection control circuit 15.

A detection circuit 65 of the current detection unit 63 includes a comparator CP61 with the same hysteresis as that of the comparator CP1 provided in the detection circuit 13, switches SW61 and SW62, and so on. A non-inverting input terminal of the comparator CP61 receives a current detection signal IS. An inverting input terminal of the comparator CP61 receives a reference voltage Vref1 through the switch SW61, and also receives a reference voltage Vref2 through the switch SW62.

The reference voltage Vref1 is a voltage corresponding to the same detection threshold as the reference voltage Vref in the first embodiment. On the other hand, the reference voltage Vref2 is a voltage corresponding to an overcurrent determination threshold, and is a voltage higher than the reference voltage Vref1. The overcurrent determination threshold is used when detecting that an excessive current flows through the transistor Q4, that is, when detecting the overcurrent.

The fault detection control circuit 64 turns on and off the switches SW61 and SW62. As in the fault detection control circuit 15, the fault detection control circuit 64 has a function of detecting a fault of the transistor Q4, and also has a function as an overcurrent detection circuit for detecting that an excessive current exceeding the overcurrent determination threshold flows in the transistor Q4. The fault detection control circuit 64 may have a configuration functioning as an overcurrent detection circuit alone, or a configuration functioning as an overcurrent detection circuit in cooperation with the external control device 20.

The fault detection control circuit 64 turns on the switch SW61 and turns off the switch SW62, at the time of starting the power supply circuit 62, and so on. Therefore, it may be possible to execute the same fault detection process as in the first embodiment at the time of startup or the like. Further, the fault detection control circuit 64 turns off the switch SW61 and turns off the switch SW62 in the normal state. Therefore, it may be possible to execute the overcurrent detection described above in the normal state.

According to the present embodiment described above, since the same fault detection as that of the first embodiment may be executed, the same effects as those of the first embodiment may be obtained. Furthermore, in the present embodiment, a part of the configuration of the overcurrent detection circuit for detecting that the overcurrent flows in the transistor Q4, specifically the comparator CP61 is shared so as to configure the current detection unit 63 for use in fault detection. With the above configuration, the circuit element may be reduced by the amount of the configuration shared, as a result of which the effect that the circuit scale of the power supply circuit 62 may be reduced is obtained.

Seventh Embodiment

Figure 12:
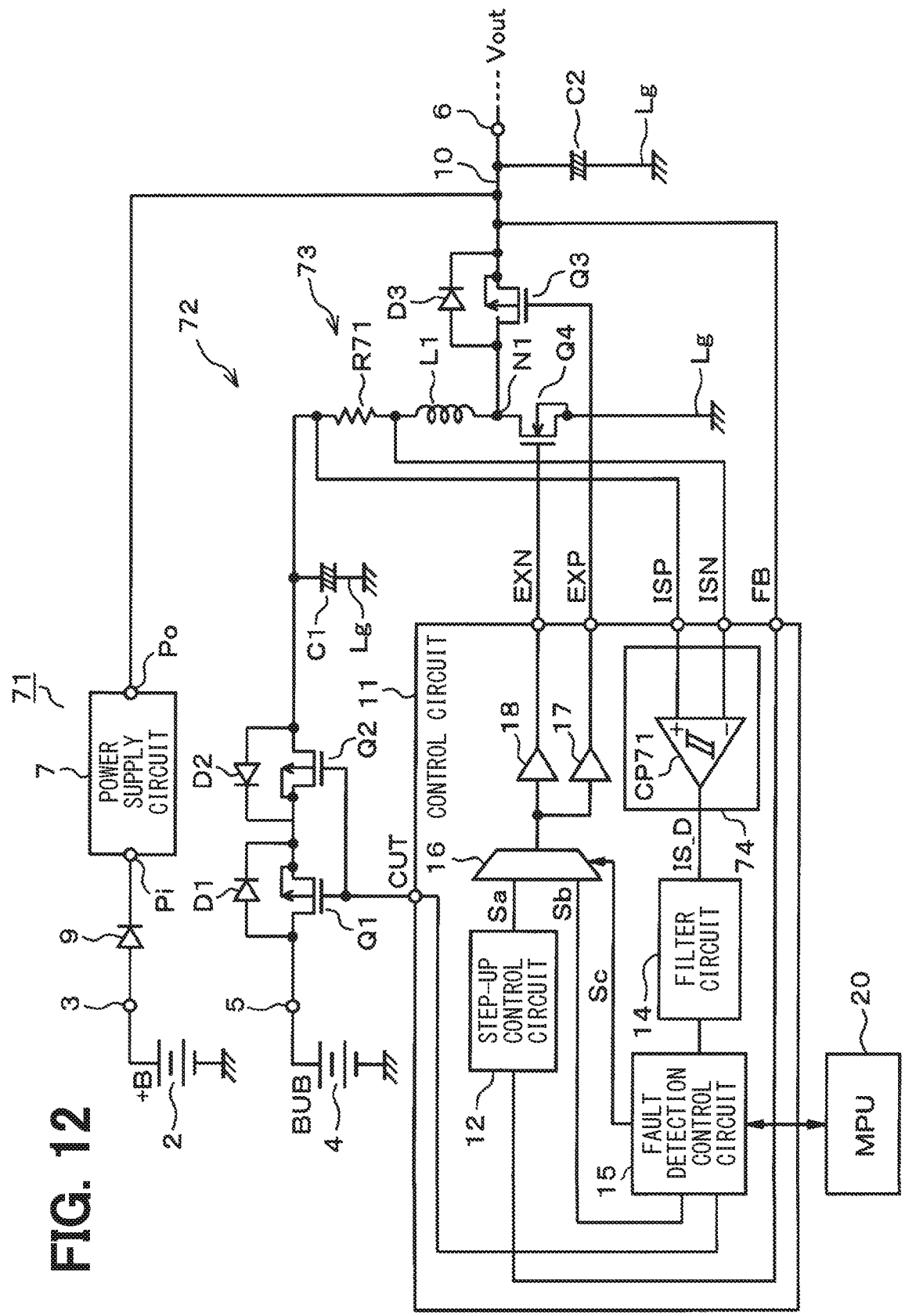
FIG. 12 is a diagram schematically showing a configuration of a power supply system according to a seventh embodiment.

The following describes a seventh embodiment with reference to FIG. 12.

As shown in FIG. 12, a power supply circuit 72 provided in a power supply system 71 according to the present embodiment is different from the power supply circuit 8 according to the first embodiment in that a current detection unit 73 is provided in place of the current detection unit 19. The current detection unit 73 detects a current flowing through a transistor Q4 similarly to the current detection unit 19, but is different from the current detection unit 19 in the following points.

In other words, the current detection unit 19 is configured for a low side current detection in which a resistor R1, which is a shunt resistor, is provided on a low side of the transistor Q4. In contrast, the current detection unit 73 is configured for a high-side current detection in which a resistor R71, which is a shunt resistor, is provided on a high side of the transistor Q4.

Specifically, one terminal of the resistor R71 is connected to a drain of a transistor Q2, and the other terminal of the resistor R71 is connected to a node N1 through an inductor L1. Each terminal voltage of the resistor R71 is input to the detection circuit 74 as current detection signals ISP and ISN, which are voltage signals corresponding to a current flowing through the transistor Q4.

The detection circuit 74 detects a current flowing through the transistor Q4 based on the terminal voltage of the resistor R71, and includes a comparator CP71 with hysteresis. A current detection signal ISP is input to a non-inverting input terminal of the comparator CP71, and a current detection signal ISN is input to an inverting input terminal.

Even the power supply circuit 72 having a current detection unit 73 configured for the high-side current detection as described above can execute the same fault detection as that of the power supply circuit 8 according to the first embodiment having the current detection unit 19 configured for the low-side current detection. Therefore, the present embodiment has the same advantageous effects as those of the first embodiment.

Eighth Embodiment

Figure 13:
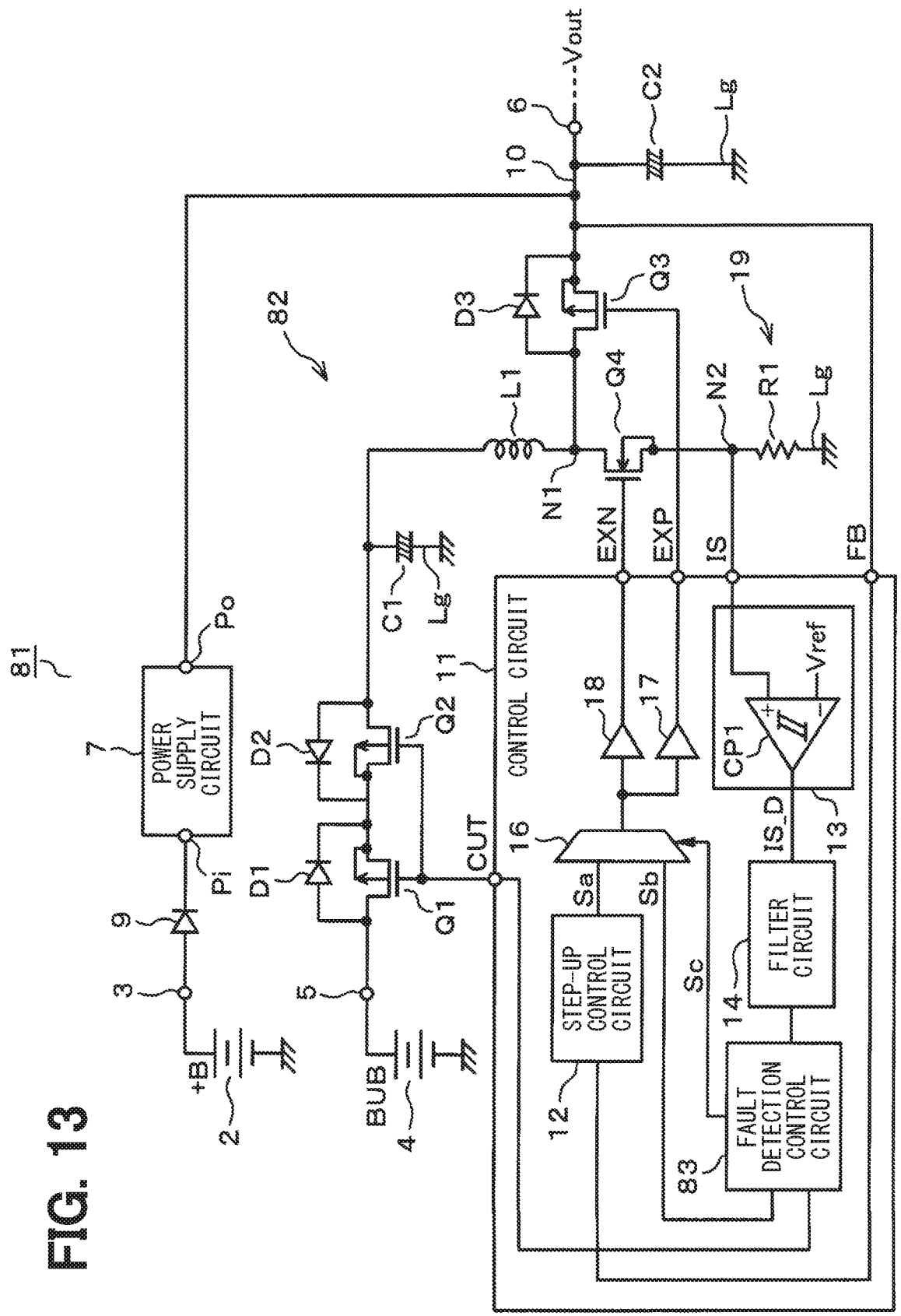
FIG. 13 is a diagram schematically showing a configuration of a power supply system according to an eighth embodiment.
Figure 14:
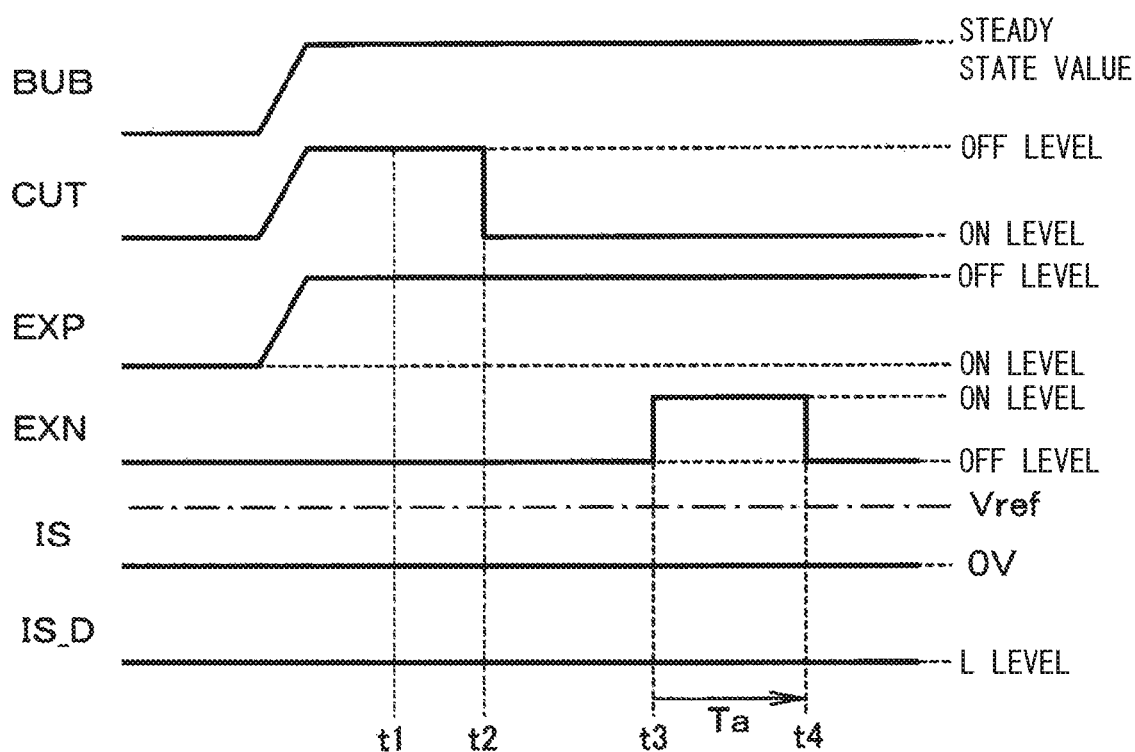
FIG. 14 is a diagram illustrating the operation of the power supply circuit when an open-circuit fault occurs according to the eighth embodiment, and schematically showing a waveform of a signal of each part.

The following describes the eighth embodiment with reference to FIGS. 13 and 14.

As shown in FIG. 13, a power supply circuit 82 provided in a power supply system 81 according to the present embodiment is different from the power supply circuit 8 according to the first embodiment in that a fault detection control circuit 83 is provided in place of the fault detection control circuit 15 and the like. The fault detection control circuit 83, like the fault detection control circuit 15, has a function of detecting a fault of a transistor Q4. However, the fault detection control circuit 83 has a time-out function, and executes a fault detection of the transistor Q4 without executing a communication with an external control device 20. In the configuration of the present embodiment, the operation at the time of occurrence of an open-circuit fault is shown in FIG. 14.

The operation at a time when the transistor Q4 is turned on, that is, up to a time t3 is the same as the operation according to the configuration of the first embodiment shown in FIG. 6. However, the fault detection control circuit 83 turns off the transistor Q4 at a time t4 at which a predetermined time Ta has elapsed without inverting an output signal IS_D after determining that an open-circuit fault has occurred in the transistor Q4.

Even the power supply circuit 82 configured for executing a fault detection of the transistor Q4 without executing a communication with the external control device 20 can execute the detection of the short-circuit fault and the detection of the open-circuit fault in the same manner as that of the first embodiment. Therefore, the present embodiment has the same advantageous effects as those of the first embodiment.

Other Embodiments

Various modifications and alterations of this disclosure will become apparent to those skilled in the art without departing from the scope and principles of this disclosure, and it should be understood that this disclosure is not to be unduly limited to the illustrative embodiments set forth herein.

The present disclosure is not limited to the power supply circuits 8, 22, 32, 42, 52, 62, 72, and 82 applied to the wireless communication ECU mounted on the vehicle, but may be applied to all step-up switching power supply circuits.

The present disclosure has been described in accordance with the embodiments. However, the present disclosure is not limited to such embodiments and structures. The present disclosure also encompasses various modifications and variations within the scope of equivalents. Furthermore, various combination and formation, and other combination and formation including one, more than one or less than one element may be made in the present disclosure.

What is claimed is:

1. A step-up switching power supply circuit for executing a step-up operation for stepping up an input voltage supplied through an input terminal, the step-up switching power supply circuit comprising:
   an inductor;
   a switching element enlarging a current flowing through the inductor when the switching element is turned on;
   a step-up control circuit configured to output a control signal to control driving of the switching element to execute the step-up operation;
   a fault detection control circuit configured to output a control signal to control the driving of the switching element to detect a fault of the switching element;
   a current detection unit configured to detect a current flowing through the switching element; and
   a switching unit including a selector that executes switchover to output one of the control signal output from the step-up control circuit and the control signal output from the fault detection control circuit, and configured to execute switchover between the step-up control circuit and the fault detection control circuit to enable one of the step-up control circuit and the fault detection control circuit to control the driving the switching element based on the control signal output from the selector,
   wherein, prior to execution of the step-up operation, the switching unit executes the switchover to enable the fault detection control circuit to control the driving of the switching element, and the fault detection control circuit turns on the switching element and detects an open-circuit fault of the switching element based on a detection result of the current detected by the current detection unit.

2. The step-up switching power supply circuit according to claim 1, further comprising:
   an electrical conduction switch disposed in series with a power supply path extending to the inductor from the input terminal,
   wherein the fault detection control circuit is configured to turn on and off the electrical conduction switch, and
   wherein, prior to the execution of the step-up operation, the fault detection control circuit turns on the electrical conduction switch, and detects a short-circuit fault of the switching element based on the detection result of the current detected by the current detection unit.

3. The step-up switching power supply circuit according to claim 2,
wherein the fault detection control circuit detects the short-circuit fault of the switching element prior to detection of the open-circuit fault of the switching element.

4. The step-up switching power supply circuit according to claim 1,
wherein the current detection unit includes;
a shunt resistor disposed in series between the switching element and a ground; and
a detection circuit configured to detect a current flowing through the switching element based on a terminal voltage of the shunt resistor, and
wherein the detection circuit operates with the ground as a reference potential.

5. The step-up switching power supply circuit according to claim 1,
wherein the current detection unit includes:
a shunt resistor disposed in series with a path through which a current flows into the switching element;
an amplifier circuit configured to amplify a terminal voltage of the shunt resistor; and
a detection circuit configured to detect the current flowing through the switching element based on an output voltage of the amplifier circuit.

6. The step-up switching power supply circuit according to claim 1, further comprising:
an overcurrent detection circuit configured to detect that an excessive current exceeding an overcurrent determination threshold has flowed through the switching element,
wherein the current detection unit is configured by sharing at least a part of a configuration of the overcurrent detection circuit.

* * * * *